(12) United States Patent
Winkler et al.

(10) Patent No.: US 10,978,270 B2
(45) Date of Patent: Apr. 13, 2021

(54) CHARGED PARTICLE BEAM DEVICE, INTERCHANGEABLE MULTI-APERTURE ARRANGEMENT FOR A CHARGED PARTICLE BEAM DEVICE, AND METHOD FOR OPERATING A CHARGED PARTICLE BEAM DEVICE

(71) Applicant: ICT Integrated Circuit Testing Gesellschaft für Halbleiterprüftechnik mbH, Heimstetten (DE)

(72) Inventors: Dieter Winkler, Munich (DE); Thomas Jasinski, Bühlertal (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 135 days.

(21) Appl. No.: 16/225,405

(22) Filed: Dec. 19, 2018

(65) Prior Publication Data

US 2020/0203116 A1 Jun. 25, 2020

(51) Int. Cl.
*H01J 37/20* (2006.01)
*H01J 37/09* (2006.01)

(52) U.S. Cl.
CPC .......... *H01J 37/20* (2013.01); *H01J 37/09* (2013.01); *H01J 2237/0458* (2013.01); *H01J 2237/20228* (2013.01)

(58) Field of Classification Search
CPC .. H01J 37/20; H01J 37/09; H01J 2237/20228; H01J 2237/0455; H01J 2237/0458; H01J 2237/28; H01J 2237/0268; H01J 2237/0453; H01J 37/04; H01J 37/26; H01J 2237/0492; H01J 2237/0435; H01J 2237/06375
See application file for complete search history.

(56) References Cited

U.S. PATENT DOCUMENTS

| 9,263,233 | B2 | 2/2016 | Zeidler et al. | |
|---|---|---|---|---|
| 9,666,406 | B1* | 5/2017 | Lanio | H01J 37/1475 |
| 2003/0183778 | A1* | 10/2003 | Haraguchi | B82Y 40/00 250/492.2 |
| 2005/0242303 | A1* | 11/2005 | Platzgummer | B82Y 10/00 250/492.22 |
| 2016/0284505 | A1* | 9/2016 | Ren | H01J 37/28 |

(Continued)

FOREIGN PATENT DOCUMENTS

| EP | 2 622 626 A1 | 8/2013 |
|---|---|---|
| JP | 2005-328047 A | 11/2005 |

(Continued)

OTHER PUBLICATIONS

European Search Report for Application No. 19217553.7-1212, dated May 15, 2020, 11 pages.

*Primary Examiner* — Brooke Purinton
(74) *Attorney, Agent, or Firm* — Kilpatrick Townsend & Stockton LLP

(57) ABSTRACT

A charged particle beam device, comprising a charged particle source configured to emit a charged particle beam; a movable stage comprising an assembly of aperture arrays having at least a first aperture array and a second aperture array, the movable stage is configured to align the assembly of aperture arrays with the charged particle beam, and at least one aperture array comprises a shielding tube coupled to the movable stage.

16 Claims, 6 Drawing Sheets

(56) References Cited

U.S. PATENT DOCUMENTS

| | | | |
|---|---|---|---|
| 2017/0154756 A1* | 6/2017 | Ren | H01J 37/28 |
| 2017/0243717 A1* | 8/2017 | Kruit | H01J 37/28 |
| 2017/0345612 A1 | 11/2017 | Touya et al. | |
| 2018/0130632 A1* | 5/2018 | Ogasawara | H01J 37/3174 |
| 2019/0043691 A1* | 2/2019 | Zhang | H01J 37/28 |
| 2019/0066972 A1* | 2/2019 | Frosien | H01J 37/28 |
| 2019/0362928 A1* | 11/2019 | Inoue | H01J 37/1475 |

FOREIGN PATENT DOCUMENTS

| | | |
|---|---|---|
| TW | 523806 B | 3/2003 |
| TW | 2016-43561 A | 12/2016 |
| TW | 2018-41053 A | 11/2018 |
| WO | 01/60456 A1 | 8/2001 |

* cited by examiner

CHARGED PARTICLE BEAM DEVICE, INTERCHANGEABLE MULTI-APERTURE ARRANGEMENT FOR A CHARGED PARTICLE BEAM DEVICE, AND METHOD FOR OPERATING A CHARGED PARTICLE BEAM DEVICE

FIELD

Embodiments of the present disclosure relate to a charged particle beam device, an aperture arrangement for a charged particle beam device, and a method for operating a charged particle beam device. Embodiments of the present disclosure particularly relate to electron beam inspection (EBI).

BACKGROUND

Charged particle beam devices have many functions in a plurality of industrial fields, including, but not limited to, electron beam inspection (EBI), critical dimension (CD) measurements of semiconductor devices during manufacturing, defect review (DR) of semiconductor devices during manufacturing, exposure systems for lithography, detecting devices and testing systems. Thus, there is a high demand for structuring, testing and inspecting specimens within the micrometer and nanometer scale. Micrometer and nanometer scale process control, inspection or structuring can be done with charged particle beams, e.g. electron beams, which are generated and focused in charged particle beam devices, such as electron microscopes. Charged particle beams offer superior spatial resolution compared to, for example, photon beams due to the short wavelengths.

High throughput electron beam inspection (EBI) systems can utilize multibeam charged particle beam devices, such as electron microscopes, that are able to create, focus and scan multiple primary charged particle beams inside a single column of the charged particle beam device. A sample can be scanned by an array of focused primary charged particle beams, which in turn create multiple signal charged particle beams. The individual signal charged particle beams can be mapped onto detection elements.

It can be beneficial to operate charged particle beam devices in different operation modes. Switching from one operation mode to another operation mode can include extensive hardware changes and/or changes in the secondary imaging or detection optics. Hardware changes increase a downtime of the charged particle beam device. Further, hardware changes can be cumbersome and may only be done by highly skilled personnel. Changing the secondary imaging/detection optics may include time consuming recalibrations.

SUMMARY

In light of the above, a charged particle beam device and a method for operating a charged particle beam device are provided. Further aspects, benefits, and features of the present disclosure are apparent from the claims, the description, and the accompanying drawings.

According to an aspect of the present disclosure, a charged particle beam device is provided. The charged particle beam device comprises a charged particle source configured to emit a charged particle beam, a movable stage comprising an assembly of aperture arrays having at least a first aperture array and a second aperture array, wherein the first aperture array comprises two or more first apertures and the second aperture array comprises two or more second apertures, wherein a size of the first apertures is different form the size of the second aperture. The movable stage is configured to align the assembly of aperture arrays with the particle beam. At least one aperture array comprises shielding, such as e.g. a liner tube for shielding.

According to another aspect of the present disclosure, a method for operating a charged particle beam device is provided. The method includes operation the charged particle beam device and/or operating a movable stage to change an aperture aligned with the charged particle beam.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus. The method includes method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF EMBODIMENTS

Figure 1:
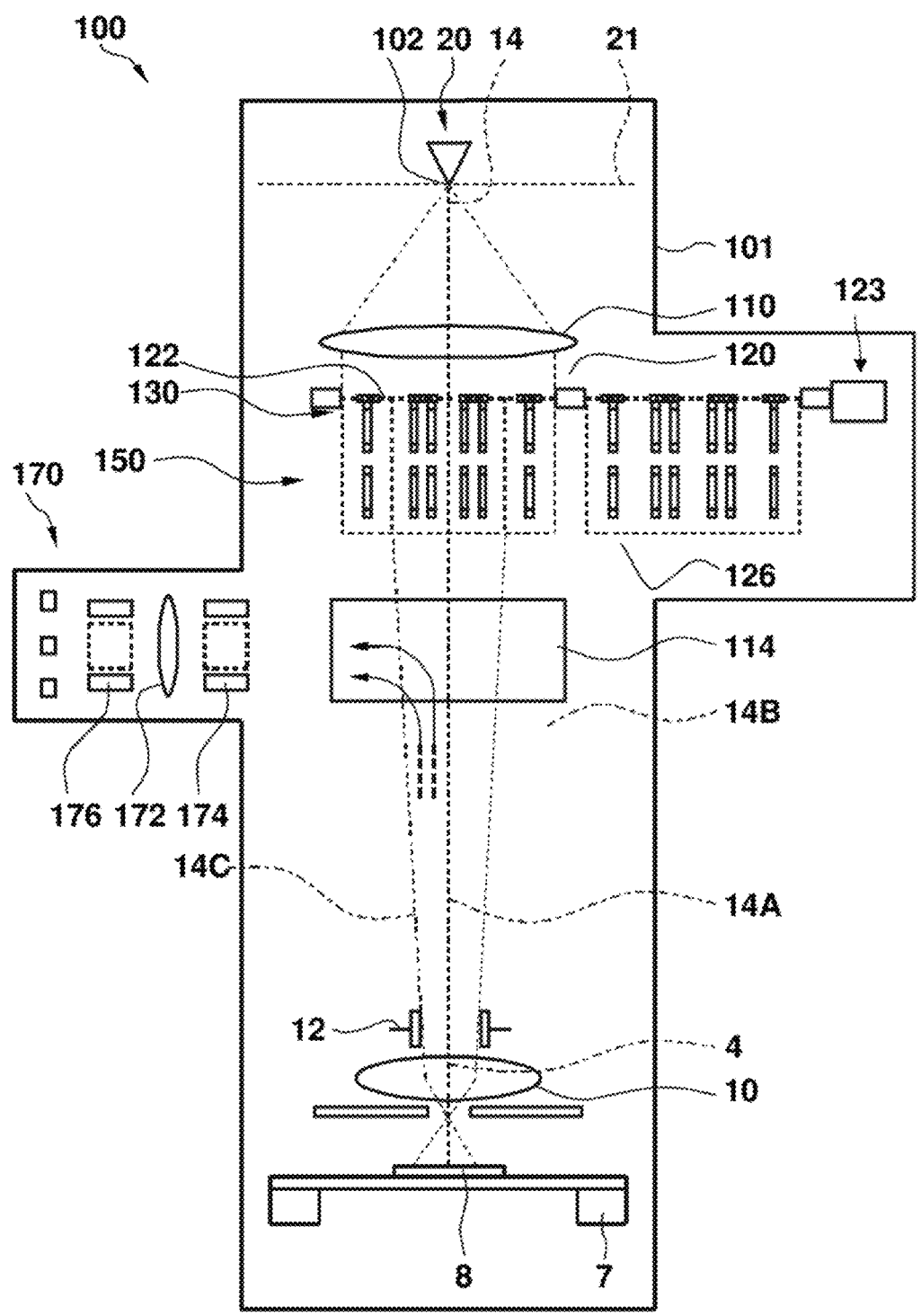
FIG. 1 shows a schematic view of a charged particle beam device according to embodiments described herein.

Reference will now be made in detail to the various embodiments of the disclosure, one or more examples of which are illustrated in the figures. Within the following description of the drawings, the same reference numbers refer to same components. Only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

Without limiting the scope of protection of the present application, in the following the charged particle beam device or components thereof will exemplarily be referred to as a charged particle beam device using electrons as charged particles. However, other types of primary charged particles, e.g. ions, could be used. Upon irradiation of a specimen or sample by a charged particle beam (also referred to as "primary charged particle beam"), signal charged particles, such as secondary electrons (SE), are created, which may carry information about the topography, chemical constituents and/or electrostatic potential of the sample and others. The signal charged particles can include at least one of secondary electrons, backscattered electrons and Auger electrons. The signal charged particles can be collected and guided to a sensor, e.g., a scintillator, a pin diode or the like.

High throughput electron beam inspection (EBI) systems can utilize multibeam charged particle beam devices, such as electron microscopes, that are able to create, focus and scan multiple primary charged particle beams or beamlets, for example, inside a single column of the charged particle beam device. A sample can be scanned by an array of focused primary charged particle beamlets, which in turn create multiple signal charged particle beams or beamlets. The individual signal charged particle beamlets can be mapped onto one or more detection elements. For example, to change an aperture and/or the number of beamlets, an assembly of aperture arrays can be moved with a movable stage to align the at least one aperture with the charged particle beam.

A charged particle beam device, an aperture arrangement for a charged particle beam device, and a method for operating a charged particle beam device that overcome at least some of the problems in the art are beneficial. The present disclosure particularly aims at providing a particle beam device having a movable stage configured to align the at least one aperture of the assembly of aperture arrays with the particle beam.

The present disclosure uses two or more sets of openings. The sets of openings can be referred to as "aperture arrays". The opening can be referred to as "apertures". The apertures can generate two or more beamlets of a charged particle beam. The two or more sets of openings can be moved with a movable stage such that either a set of first openings of the two or more sets of openings is positioned in the beam path of the primary charged particle beam or a second set of second openings of the two or more sets of openings is positioned in the beam path of the primary charged particle beam. The first openings and the second openings may be different, e.g., in diameter. The first openings can be used for (or, at least in part, provide) a first operation mode, such as an imaging mode, and the second openings can be used for (or, at least in part, provide) a second operation mode, such as a charging mode. According to embodiments of the present disclosure a variable current multibeam system can be provided, for example, a variable current multibeam system using a movable stage.

Accordingly, the present disclosure can provide a fast way to change beam currents and/or aperture sizes without deflecting the beam. According to an embodiment of the present disclosure a charged particle beam device is provided. The charged particle beam device includes a charged particle source configured to emit a charged particle beam and a movable stage comprising an assembly of aperture arrays having at least a first aperture array and a second aperture array. For example, the first aperture array comprises two or more first apertures and the second aperture array comprises two or more second apertures. The movable stage is configured to align the assembly of aperture arrays with the particle beam. At least one aperture array comprises shielding, for example, a liner tube for shielding, coupled to the movable stage.

A charged particle beam device as described herein and a method of operating a charged particle beam device, as well as other embodiments described herein allow working with different resolution and current values for a multi-electron beam system. Providing a movable stage allows changing between aperture arrays. The movable stage may have at least one shielding tube. As compared to single beam electron microscopes selecting different beam limiting apertures by beam deflection, embodiments of the present disclosure allow for an improved switching between aperture arrays for multibeam applications. A movable stage, on which several aperture arrays are positioned, allows for choosing between aperture arrays, such as for example, beam splitter arrays generating a plurality of primary charged particle beamlets from primary charged particle beam. For example, switching between different aperture sizes can be provided without deflecting the primary charged particle beam. Accordingly, the different aperture arrays may serve as a beam splitter generating the primary beamlets from a primary charged particle beam. According to various embodiments of the present disclosure, a beam splitter array or a beam splitter includes an array of apertures and an array of electro-optical elements, such as deflectors, to split the primary beam into a plurality of beamlets, i.e. beamlets on different sample locations. Embodiments of the present disclosure provide two or more beam splitter arrays, wherein, for example, aperture sizes of the aperture arrays may vary.

The present disclosure may utilize electrical connections to connect a deflector to e.g. a computer, or a controller, or a connector to the outside of the charged particle beam device. The electrical connection may be a connection with e.g. wires, or conducting materials, such as e.g. metals, conducting polymers, or other conducting media, or it may be through flex printed circuit board (PCB) connections. The electrical connections may be in parallel.

According to embodiments of the present disclosure, the aperture arrays can be provided to split the primary charged particle beam into multiple charged particle beamlets. Having two or more beam splitter arrays, each for generation of a plurality of beamlets includes a plurality of deflectors. For example, two, four or eight, deflector electrodes can be provided for each beamlet. Accordingly, connection of the aperture arrays to enable operation of each array is beneficially improved. Further, interaction between deflection electrodes of different beamlets is beneficially avoided or is to be reduced. Accordingly, connection of the aperture in parallel may significantly reduce the number of connections. Further, aperture arrays with flex PCBs connected to the movable stage beneficially improves the movable range of the movable stage.

According to embodiments, which can be combined with other embodiments described herein, electrical connections to electrical components on the moving stage may be realized with one or more flex PCBs and may contain at least one ground layer. The flex PCB may contain more than one ground layer, additionally or alternatively, the flex PCB may contain less than 10 ground layers. Additionally or alternatively, at least one backup ground connection to electrical components on the moving stage may exist.

According to embodiments, which can be combined with other embodiments described herein, an aperture array of an assembly of aperture arrays may comprise apertures and deflectors. As described above, deflection electrodes providing a deflection unit can be provided for two or more beamlets, for example, each beamlet. Accordingly, a charged particle beam device as described herein may include an imaging optics, wherein the source generating the primary charged particle beam is imaged on a specimen, for example, surface of the specimen. The deflectors allow for generation of primary charged particle beamlets at different positions on the surface of the specimen, particularly, for imaging the emitter (e.g. the emitter tip or a virtual image or tip) on the surface of the specimen.

According to embodiments, which can be combined with other embodiments described herein, an assembly of aperture arrays may comprise shielding. The shielding may be e.g. a liner tube. The shielding may be below an aperture, e.g. in a vertical direction. The shielding may be below a deflector in a vertical direction. The shielding may be may be shaped as a cylinder and may, for example, be associated with at least one of an aperture array and a deflector. The shielding may beneficially reduce crosstalk between the beamlets or deflector elements for the beamlets.

According to embodiments, which can be combined with other embodiments described herein, the movable stage may have shielding, for example, having the form of a liner tube. The movable stage may have different components for moving in different directions. The movable stage may have at least two components that are movable in at least one direction. The movable at least two components may each have at least one degree of freedom, additionally or alternatively, the at least two components may have at least two degrees of freedom, or at least three degrees of freedom. The degrees of freedom may differ between the movable components of a movable stage.

According to embodiments, which can be combined with other embodiments described herein, the at least two components of the movable stage may each have at least one motor. The motor may be an electric motor, such as e.g. a piezo motor. The motor may be configured to hold a position of the component of the movable stage in the case that e.g. an electrical connection to the motor is disconnected, or a power supply to the motor may be switched off. A movable stage as described herein may also be referred to as Piezo stage.

According to embodiments, which can be combined with other embodiments described herein, the movable stage may have two movable components. Furthermore, the first movable component and the second movable component may have a different number of liner tubes for shielding. The first movable component that may be above or at least partially above the second movable component in a vertical direction may have an assembly of aperture arrays having at least a first aperture array and a second aperture array. The first aperture array may have at least one first aperture, additionally or alternatively at least two apertures. The second aperture array may have at least one, additionally or alternatively at least two second apertures, wherein a size of the first aperture is different from the size of the second aperture. According to embodiments of the present disclosure, an assembly of aperture arrays having at least a first aperture array and a second aperture array includes at least one aperture array with two or more apertures. One aperture array may optionally have at least one aperture. The second movable component may have no assembly of aperture arrays. The second movable component may have a number of liner tubes for shielding that is smaller than the number of liner tubes for shielding of the first movable component.

A component of the charged particle beam device below the second movable component in the direction of a charged particle beam or a vertical direction, such as for example an anti-vibration support, may have at least one liner tube for shielding. The at least one liner tube of the component of the charged particle beam device may be centered with the charged particle beam. The liner tube of the component or of a movable component may be secured with e.g. a latching coil spring, or a screw, or a bolt. The liner tube may be held in place by a form-locking arrangement or a bonding, such as welding or gluing.

According to embodiments, which can be combined with other embodiments described herein, an assembly of aperture arrays may comprise one, additionally or alternatively two, three, or four, additionally or alternatively at least one, at least two, at least three, or at least four, alternatively or additionally less than 25, less than 17, less than 10, or less than five aperture arrays. The aperture arrays may comprise at least a first aperture and a second aperture, wherein the first aperture has a different size than the second aperture.

According to embodiments, which can be combined with other embodiments described herein, an aperture array may have apertures arranged in a geometric shape, such as e.g. a circle, a rectangle, a square, or an n-sided polygon, wherein n can be any natural number. An aperture array may have randomly arranged apertures.

According to embodiments, which can be combined with other embodiments described herein, a particle trap may be provided with the movable stage. The moving of the movable stage may result in abrasion of material. Abraded material may have an influence on the image quality and should thus be prevented. A particle trap may trap the abraded materials with e.g. an electrical trapping method, such as e.g. static electricity. The particle trap may trap abraded material with, for example, a mechanical method, such as brushes, or mechanical scrapers.

FIG. 1 shows a schematic view of a charged particle beam device 100 according to embodiments described herein. The charged particle beam device 100 can be an electron microscope, such as a scanning electron microscope (SEM) having for example, a multibeam column. The charged particle beam device 100 includes a column having a column housing 101.

The charged particle beam device 100 includes a charged particle source 20 configured to emit a primary charged particle beam 14, a condenser lens arrangement 110, an assembly of aperture arrays 120 comprising a first aperture array 122 and a second aperture array 126. The aperture array can be configured to generate two or more beamlets 14A, 14B, 14C of the charged particle beam 14. A multipole arrangement 130 is configured to act on the two or more beamlets 14A, 14B, 14C. The first and the second aperture array 122, 126 include a plurality of first openings and a plurality of second openings. The plurality of first openings can be different from the plurality of second openings. The assembly of aperture arrays 120 is configured to align either the plurality of first openings or the plurality of second openings with the charged particle beam 14.

According to some embodiments, which can be combined with other embodiments described herein, one single charged particle source can be provided. The charged particle source 20 can be a high brightness gun. For example, the charged particle source 20 can be selected from the group including a cold field emitter (CFE), a Schottky emitter, a TFE, or another high current e-beam source. The source can be at a potential of −30 kV and the emitted electrons are accelerated to an energy of 30 keV by an extractor electrode and anode held at ground. The source can be configured to provide a uniform illumination to an angle of ~40 mrad, e.g. at 30 kV extraction voltage.

The exemplary charged particle beam device of FIG. 1 further comprises a movable stage 150. The movable stage is configured to move an aperture array 122, 126 of the assembly of aperture arrays to align with the primary charged particle beam 20. An actuator assembly 123 is coupled to the movable stage, for example, to move the movable stage 150.

According to some embodiments, which can be combined with other embodiments described herein, an actuator assembly 123 may comprise at least one of the exemplary list of a stepper motor, a servomotor, a linear motor, an electric motor, a piezo driven motor, or a geared motor.

The condenser lens arrangement collimates the primary charged particle beam 14. The primary charged particle beam is guided onto one aperture array by the condenser lens. The condenser lens arrangement 110 can include a magnetic condenser lens or an electrostatic condenser lens, or a combined magnetic electrostatic magnet condenser lens. The magnification and/or the current of the beamlets can be controlled by the condenser lens arrangement. Further, the condenser lens arrangement may include two or more of the above-mentioned condenser lenses.

The condenser lens arrangement 110 illuminates the aperture array 121A with the (primary) charged particle beam 14, such as an electron beam. The resulting two or more beamlets 14A, 14B, 14C can be deflected using deflectors of the multipole arrangement 130 such that the two or more beamlets 14A, 14B, 14C appear to come from different sources. For example, the electrons of the beamlets 14A, 14B and 14C appear to be emitted from different locations in a plane 21 of the charged particle source 20 perpendicular to an optical axis 4. As shown in FIG. 1, the electrons provided by the source appear to come from a virtual source 102 due to the action of the condenser lens arrangement 110. Further, there can be sources due to the combined action of the deflectors and the condenser lens arrangement 110. The center source may correspond to the charged particle source 20. The other sources can be virtual sources with an off-set in a plane 21 perpendicular to the optical axis 4.

According to some embodiments, which can be combined with other embodiments described herein, the condenser lens arrangement includes one or more condenser lenses, such as a single condenser lens or two or more condenser lenses. A condenser lens arrangement can be configured to provide a beam path with cross-over and/or a beam path without cross-over. The condenser lens arrangement 110 can have an adjustable lens excitation for at least one of changing a focal length and changing an illumination angle of the aperture array 122. For example, the condenser lens arrangement can be provided with a controllable lens excitation for a focal length change enabling a variable source magnification and/or demagnification. Additionally or alternatively, the condenser lens arrangement can be provided with the controllable lens excitation for controlling the illumination angle of the aperture arrangement and/or the multipole arrangement (e.g., a deflector array). In some implementations, the condenser lens arrangement 110 can provide an essentially parallel illumination of the aperture array 122.

The aperture array 122 separates the primary beam emitted by the charged particle source in primary beamlets. The aperture array can be considered as a portion of a beam splitter and may, for example, be at ground potential. The beam splitter separates the primary charged particle beam into multiple beamlets. The openings in the aperture array 122 and, thus, the beamlets may be arranged in an array form or a ring form.

According to some embodiments, which can be combined with other embodiments described herein, a beam separator 114, i.e., a separator separating the primary beamlets from the signal beamlets, can be provided by magnetic deflectors or a combination of magnetic and electrostatic deflectors, e.g. a Wien filter. A scanning deflector 12 may scan the beam or beamlets over the surface of the sample 8. The primary beamlets, i.e. the two or more beamlets, are focused on the specimen or sample 8 using a common objective lens. The primary beamlets can pass through one opening in the objective lens 10. The sample 8 is provided on a sample stage 7, which can be configured to move the sample 8 in at least one direction perpendicular to the optical axis 4. Due to the combined effects of the deflectors, e.g., electrostatic multipole devices, and the objective lens 10, multiple spots (images of the beam source 2), each corresponding to one of the beamlets are created on the specimen or sample 8.

According to some embodiments, which can be combined with other embodiments described herein, the objective lens 10 can be an electrostatic magnetic compound lens, particularly having an electrostatic lens that reduces the energy within the column from a high energy within the column to a lower landing energy. The energy reduction from the column energy to the landing energy can be at least a factor of 10, for example at least a factor of 30.

A "sample" or "specimen" as referred to herein, includes, but is not limited to, semiconductor wafers, semiconductor workpieces, and other workpieces such as memory disks and the like. Embodiments of the disclosure may be applied to any workpiece on which material is deposited or any workpiece which is structured. Upon irradiation of the sample 8 by the electron beam, signal charged particles, such as secondary electrons (SE), are created, which may carry information about the topography, chemical constituents and/or electrostatic potential of the sample and others. The secondary electrons can include at least one of backscattered electrons and Auger electrons. The signal charged particles can be collected and guided to a detector device, which can be a sensor, e.g., a scintillator, a pin diode or the like.

In some implementations, a retarding field including a potential provided to the sample 8 can be provided. According to yet further implementations, which can be combined with other embodiments described herein, a configuration, in which the column is at ground potential and the charged particle source 20 and the sample 8 are at a high potential can be provided. For example, most or all of the column components can be provided at ground potential.

As for instance shown in FIG. 1, a plurality of or all primary beamlets can be scanned across the surface of the sample 8 using a common scanning deflector. According to some embodiments, which can be combined with other embodiments described herein, the scanning deflector 12 can be within the objective lens 10 or close to the objective lens 10. According to some embodiments, which can be combined with other embodiments described herein, the scanning deflector 12 can be an electrostatic and/or magnetic octupole.

The charged particle beam device 100 shown in FIG. 1 includes a signal electron optics. Particles released from or backscattered from the sample 8 form signal beamlets carrying information about the sample 8. The information can include information about the topography of the sample 8, the chemical constituents, the electrostatic potential, and others. The signal beamlets are separated from the primary beamlets using the beam separator 114. A beam bender (not shown) may optionally be provided. The beam separator can, for example, include at least one magnetic deflector, a Wien filter, or any other devices, wherein the electrons are directed away from the primary beam, e.g. due to the velocity depending Lorenz force.

The signal beamlets can be focused by a focusing lens 172. The focusing lens 172 focuses signal beamlets on detector elements of a detector assembly 170, such as sensors, scintillators, pin diodes or the like. For example, a detector assembly may include a first sensor to detect a first signal beamlet generated by a first beamlet and a second sensor to detect a second signal beamlet generated by a second beamlet. According to other embodiments, focusing of the secondary beamlets can be performed by a lens system which enables calibration of magnification and rotation. According to some embodiments, one or more deflectors 174, 176 are provided along the path of the signal beamlets.

Figure 2:
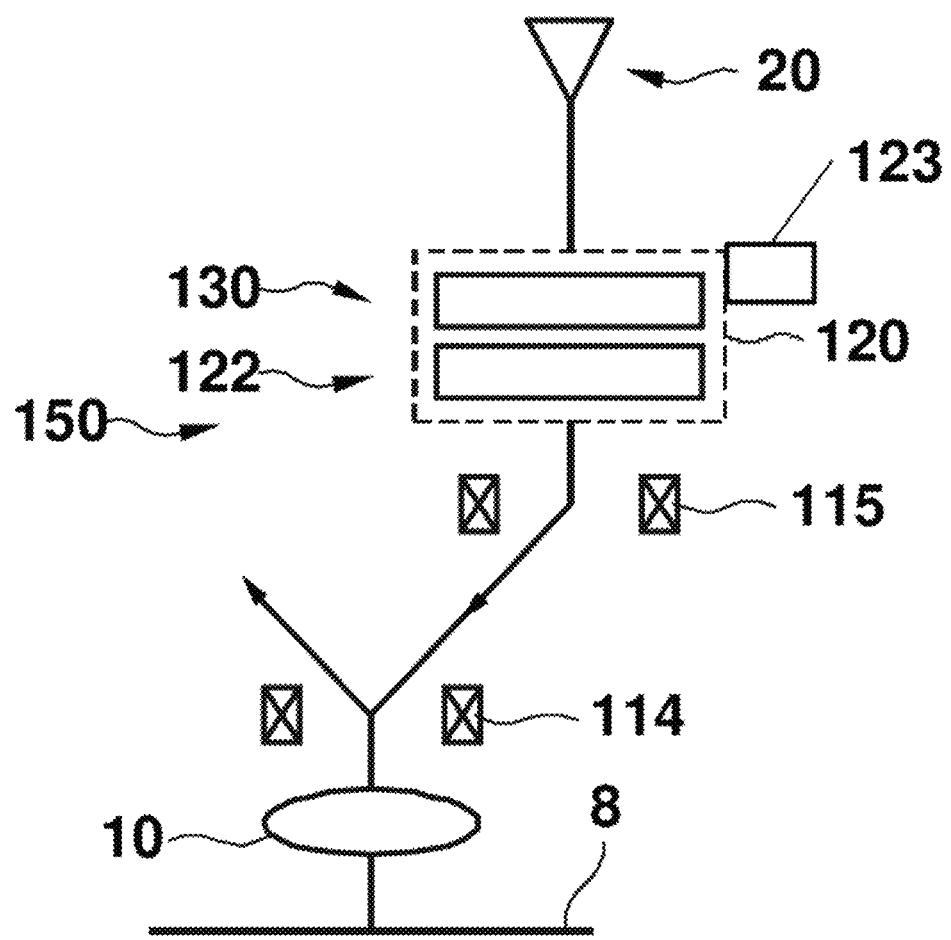
FIG. 2 shows a schematic view of a further charged particle beam device according to embodiments described herein.

FIG. 2 shows another beam path of the column including a beam separation between primary beamlets and signal beamlets. The beam separator 114 can be provided as a magnetic deflector. A further magnetic deflector 115 is provided. The two magnetic deflectors deflect the beamlets in opposite directions. The beamlets may be tilted by the first magnetic deflector 115 and aligned with an optical axis 4 of an objective lens by the second magnetic deflector. Signal beamlets return through the objective lens up to the beam separator 114 which separates signal beamlets from the primary beamlets.

According to embodiments described herein, a multi-beamlet column is provided with a number of beams, such as two or more, or 5 or more, or 8 or more, according to some examples, up to 200. The multi-beamlet column is configured such that the multi-beamlet column can also be arrayed in a multi-column system.

According to embodiments described herein, the pitch on the specimen, e.g. a wafer, i.e. a minimal distance between two primary beamlets on the specimen, can be 10 μm or above, for example 40 μm to 100 μm. Accordingly, embodiments provide a multi-beam device which generates a reasonable number of primary electron beamlets within one electron optical column, wherein crosstalk between the beamlets upon travelling through the column is reduced.

Figure 3A:
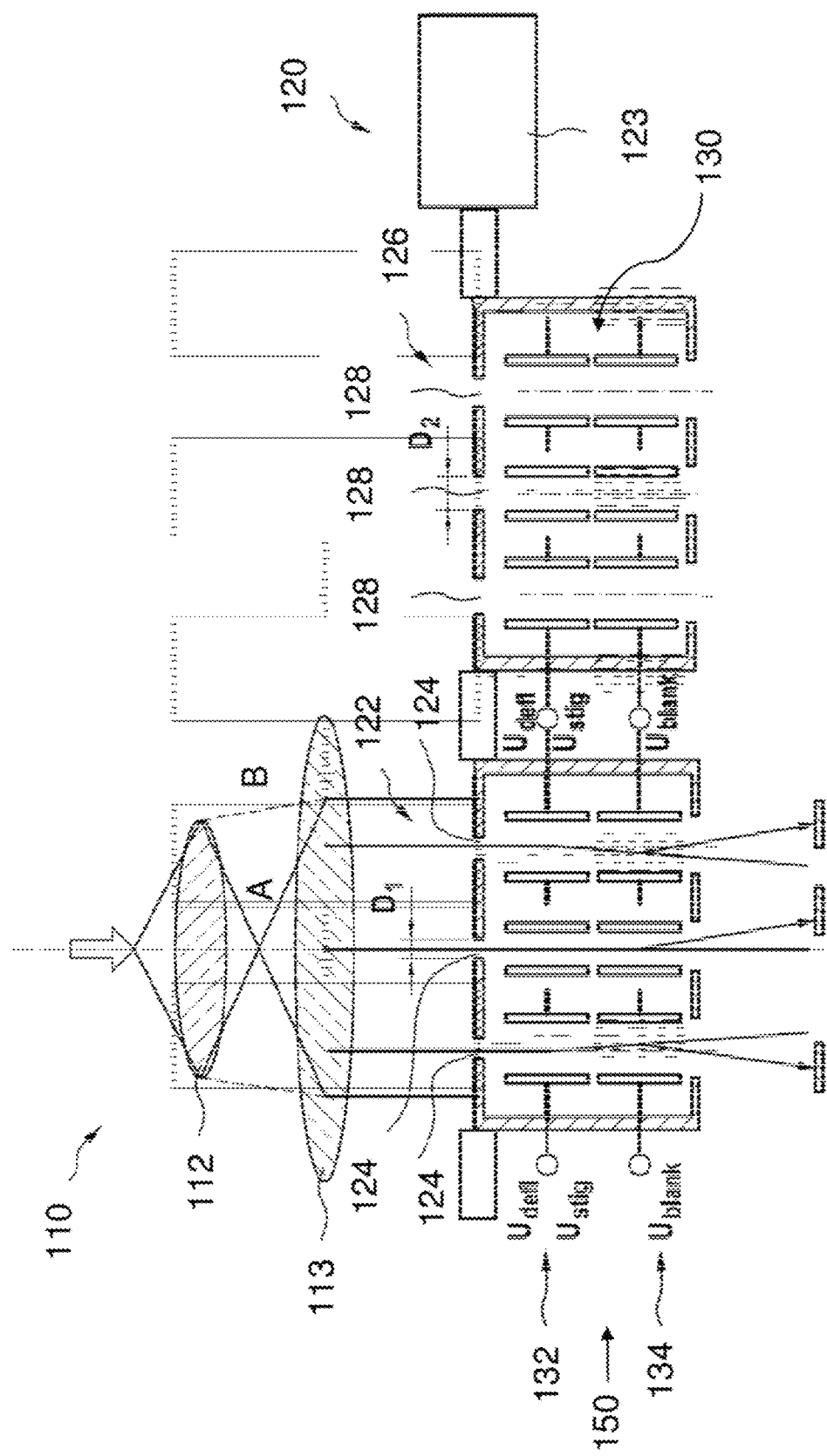
FIG. 3A shows a schematic view of a section of a charged particle beam device according to embodiments described herein.

FIG. 3A shows a schematic view of a section of a charged particle beam device according to embodiments described herein. The charged particle beam device includes the condenser lens arrangement 110, the aperture arrangement 120, and the multipole arrangement 130.

According to some embodiments, which can be combined with other embodiments described herein, the condenser lens arrangement 110 includes one or more condenser lenses, such as a single condenser lens or two or more condenser lenses. FIG. 3A illustrates an exemplary condenser lens arrangement having two or more condenser lenses, such as a first condenser lens 112 and a second condenser lens 113. The condenser lens arrangement 110 can be configured to provide a beam path A with cross-over and/or a beam path B without cross-over. The beam path A with cross-over has less stray field sensitivity. The beam path B without cross-over reduces electron-electron interaction.

The condenser lens arrangement 110 is configured to illuminate the aperture array 122, 126. The condenser lens arrangement 110 can have an adjustable lens excitation for at least one of changing a focal length and changing an illumination angle of the multipole arrangement 130. For example, the condenser lens arrangement 110 can be provided with a controllable lens excitation for a focal length change enabling a variable source magnification and/or demagnification. Additionally or alternatively, the condenser lens arrangement 110 can be provided with the controllable lens excitation for controlling the illumination angle of the aperture array 122, 126 and/or the multipole arrangement 130 (e.g., a deflector array). In some implementations, the condenser lens arrangement 110 can provide an essentially parallel illumination of the aperture array 122, 126 and/or the multipole arrangement 130.

According to some embodiments, which can be combined with other embodiments described herein, the multipole arrangement 130 may comprise, in a direction of the primary charged particle beam, one or more multipole arrangements 132, 134. Additionally or alternatively, the multipole arrangement may have at least two consecutive multipole arrangements or at least three consecutive multipole arrangements or additionally or alternatively less than five consecutive multipole arrangements in a direction of the primary charged particle beam.

In some implementations, the charged particle beam device includes at least one voltage source. The at least one voltage source can be configured to apply at least one of a first voltage $U_{defl}$ to the multipole arrangement 130 to deflect the two or more beamlets, a second voltage $U_{stig}$ to correct aberrations, and a third voltage $U_{blank}$ to selectively blank the two or more beamlets. The at least one voltage source can be configured to superimpose at least two voltages of the first voltage, the second voltage, and the third voltage. In the example of FIG. 3A, the first voltage $U_{defl}$ and the second voltage $U_{stig}$ are superimposed.

According to some embodiments, which can be combined with other embodiments described herein, the multipole arrangement includes two or more multipole stages (also referred to as "multipole layers"). The two or more multipole stages can be successively arranged or stacked along the optical axis between the aperture array 122, 126 and the sample stage and/or an objective lens. For example, each multipole stage of the two or more multipole stages can include two or more multipoles, such as dipoles, quadrupoles, hexapoles, or octopoles. A respective multipole can be provided for each one of the two or more beamlets.

In some implementations, the two or more multipole stages include a first multipole stage having two or more first multipoles and a second multipole stage having two or more second multipoles. In the example of FIG. 3A, the first voltage $U_{defl}$ and the second voltage $U_{stig}$ are superimposed and applied to the two or more first multipoles of the first multipole stage or layer. The third voltage $U_{blank}$ is applied to the two or more second multipoles of the second multipole stage or layer.

In some implementations, the first multipole stage 132 can include an octopole arrangement for deflection, astigmatism and hexapole control. Optionally, the first multipole stage 132 can be configured for focus correction e.g. by supplying a common voltage to all electrodes of the octopole. The second multipole stage 134 can be configured as a beamlet blanker. The second multipole stage 134 can for instance have a dipole arrangement (also as higher multiple architecture). The second multipole stage 134 can implement one or more further functionalities, such as a fine x-y-alignment of the two or more beamlets. The functionality between the stages or layers can be reversed or differently divided.

According to some embodiments, which can be combined with other embodiments described herein, the diameter of the plurality of first openings 124 and/or the diameter of the plurality of second openings 128 can be in a range of 1 micrometer to 2000 micrometer, specifically in a range of 10 micrometer to 400 micrometer, and more specifically in a range of 20 micrometer to 200 micrometer. A difference between the diameters can be a factor in a range of 0.5 to 50, and specifically in a range of 1.5 to 10. For example, the diameter of the plurality of first openings 124 can be the factor (e.g. 0.5) times the diameter of the plurality of second openings 128. Or, the diameter of the plurality of second openings 128 can be the factor (e.g. 0.5) times the diameter of the plurality of first openings 124.

Either the first aperture assembly 122 having the plurality of first openings 124 or the second aperture assembly 126 having the plurality of second openings 128 can be arranged in the beam path of the (primary) charged particle beam to create the two or more beamlets. In particular, the openings can be aligned with respect to the multipole arrangement 130 such that the two or more beamlets can pass through respective multipoles of the multipole arrangement 130. A beamlet of the two or more beamlets can, in some implementations, pass through a center of a multipole, or can pass off-axis or off-center through the multipole. The different openings can provide, at least in part, different operation modes, such as an imaging mode e.g. with different probe currents and a charging mode. The aperture array exchanger has different sets of apertures arranged in the deflector array configuration/geometry having different sizes whose diameters are optimized to generate an optimum.

According to some embodiments, which can be combined with other embodiments described herein, the assembly of aperture arrays 120 further includes an actuator assembly 123 configured to move the first aperture array 122 and the second aperture array 126. For example, the assembly of aperture arrays 120 can include at least a first aperture array having the plurality of first openings 124 and a second aperture array having the plurality of second openings 128. The actuator assembly 123 can be configured to move the first aperture array and the second aperture array. The actuator assembly 123 can be configured to move the first aperture array 122 into the beam path of the primary charged particle beam and optionally to move the second aperture array 126 out of the beam path of the primary charged particle beam to change an operation mode of the charged particle beam device to a first operation mode. Likewise, the actuator assembly 123 can be configured to move the second aperture array 126 into the beam path of the primary charged particle beam and optionally to move the first aperture array 122 out of the beam path of the primary charged particle beam to change an operation mode of the charged particle beam device to a second operation mode different from the first operation mode. Apertures may be replaced (for different probe sizes or currents, for reduction of contamination influences).

According to some embodiments, which can be combined with other embodiments described herein, multipole arrangements may be integrated with microelectromechanical systems (MEMS), for example to position the multipole arrangements. The multipole MEMS including wiring and driver can be identical in all operation modes.

According to some embodiments, which can be combined with embodiments described herein, the multipole arrangement 130 includes two or more multipoles. The two or more multipoles can be selected from the group including a dipole, a quadrupole, a hexapole and an octopole. The multipole arrangement 130 can be configured for at least one of to deflect the two or more beamlets, to correct aberrations, and to selectively blank the two or more beamlets. The two or more multipoles can be selected based on the function(s). For example, an octopole configuration can be used to correct astigmatism and/or can be used to correct a threefold beam deformation. In particular, an octopole electrode arrangement can be used for stigmation control but can also generate a hexapole field to correct a threefold beam deformation.

According to some embodiments, which can be combined with other embodiments described herein, an assembly of aperture arrays may comprise at least two aperture arrays or at least four aperture arrays. The at least two aperture arrays may each comprise at least two apertures, at least two deflector and shielding, such as e.g. at least one liner tube for shielding.

According to some embodiments, which can be combined with other embodiments described herein, an assembly of aperture arrays can be replaced for different probe sizes or currents. Replacing of an assembly of aperture arrays or an aperture array may reduce the effort to align deflectors with aperture arrays and/or apertures. An assembly of aperture arrays may be specifically engineered and integrated with deflectors for e.g. each aperture or each aperture array. An aperture array may be specifically engineered and integrated with deflectors for example to align each aperture or each aperture array with a deflector. The precision of deflectors, for example, the positioning relative to the aperture, may be increased. Specifically engineering and integrating an aperture array with deflectors may for example decrease the time for replacing an aperture array and deflectors.

According to embodiments, which can be combined with embodiments described herein, the column housing may be made of e.g. mumetall, or a non-magnetic material.

Figure 3B:
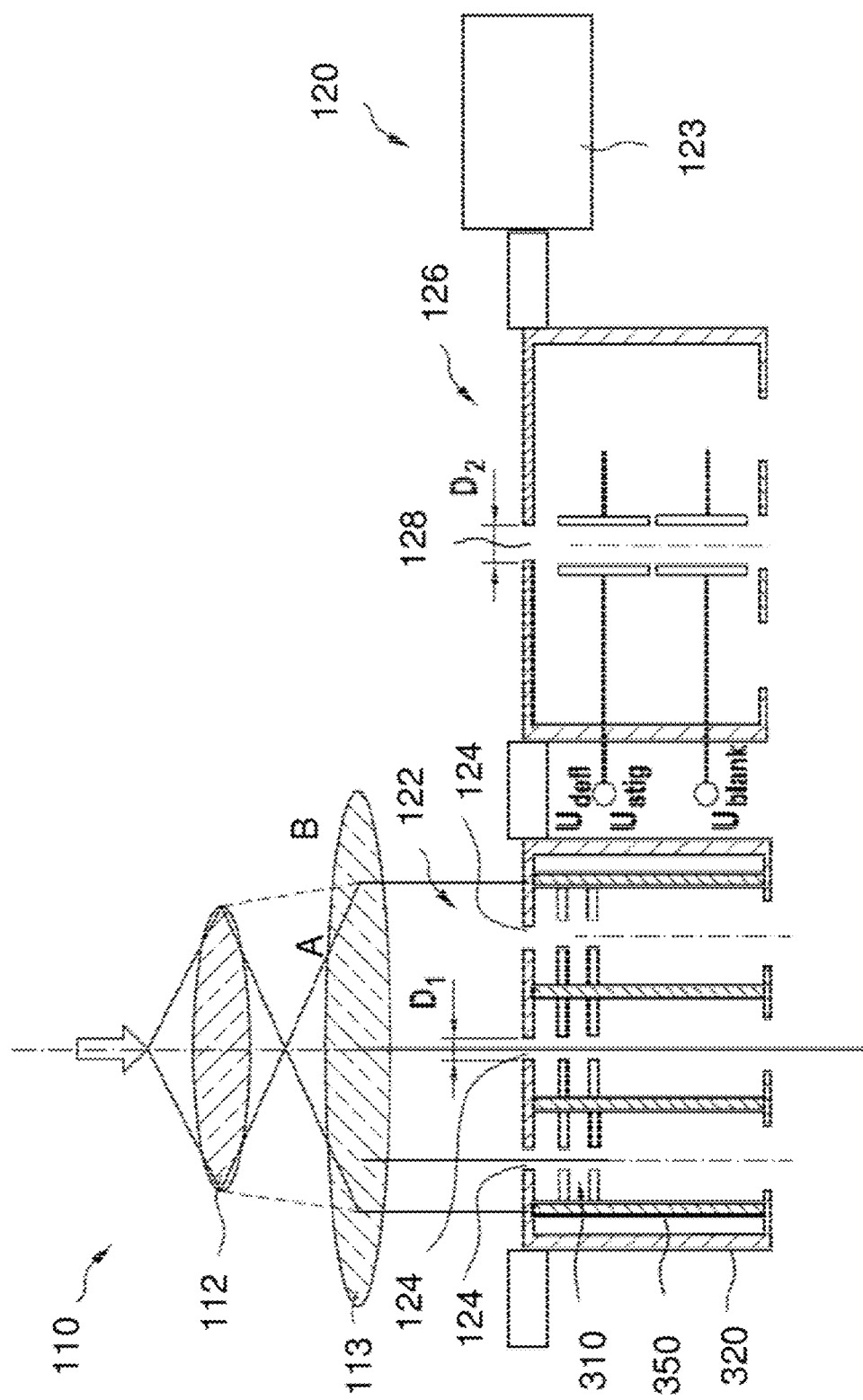
FIG. 3B shows a schematic view of a section of a charged particle beam device according to embodiments described herein.

FIG. 3B shows a schematic view of a section of a charged particle beam device according to embodiments described herein. The charged particle beam device includes the condenser lens arrangement 110, the aperture arrangement 120, and an electrostatic lens arrangement 310.

According to some embodiments, which can be combined with other embodiments described herein, an electrostatic lens arrangement may have at least one electrostatic lens, such as e.g. an Einzel lens or may have more than one electrostatic lens. One or more electrostatic lenses may be arranged in a lens arrangement below an aperture in a direction of the charged particle beam in an aperture array 122, 126. At least one electrostatic lens arrangement of the aperture array may have a separate shielding 350, such as e.g. a liner tube. The shielding 350 may shield the lens arrangement against electrical cross-talk. The lenses may be connected via electrical connections to at least one controller or a computer (similar to the deflector arrays described above) for controlling the operation of the lenses. One or more electrostatic lens arrangements may be arranged in a casing 320. The casing 320 may allow replacing or exchanging an aperture array that may be integrated with one or more electrostatic lens arrangements or one or more multipole arrangements.

FIG. 3B further exemplarily shows an aperture array having one aperture. According to some embodiments, which can be combined with other embodiments described herein, an assembly of aperture may have at least one aperture array with one aperture. The aperture may have one or more multipole arrangements. The multipole arrangements may be provided as described above for a first and a second stage of multipole arrangements.

Figure 4:
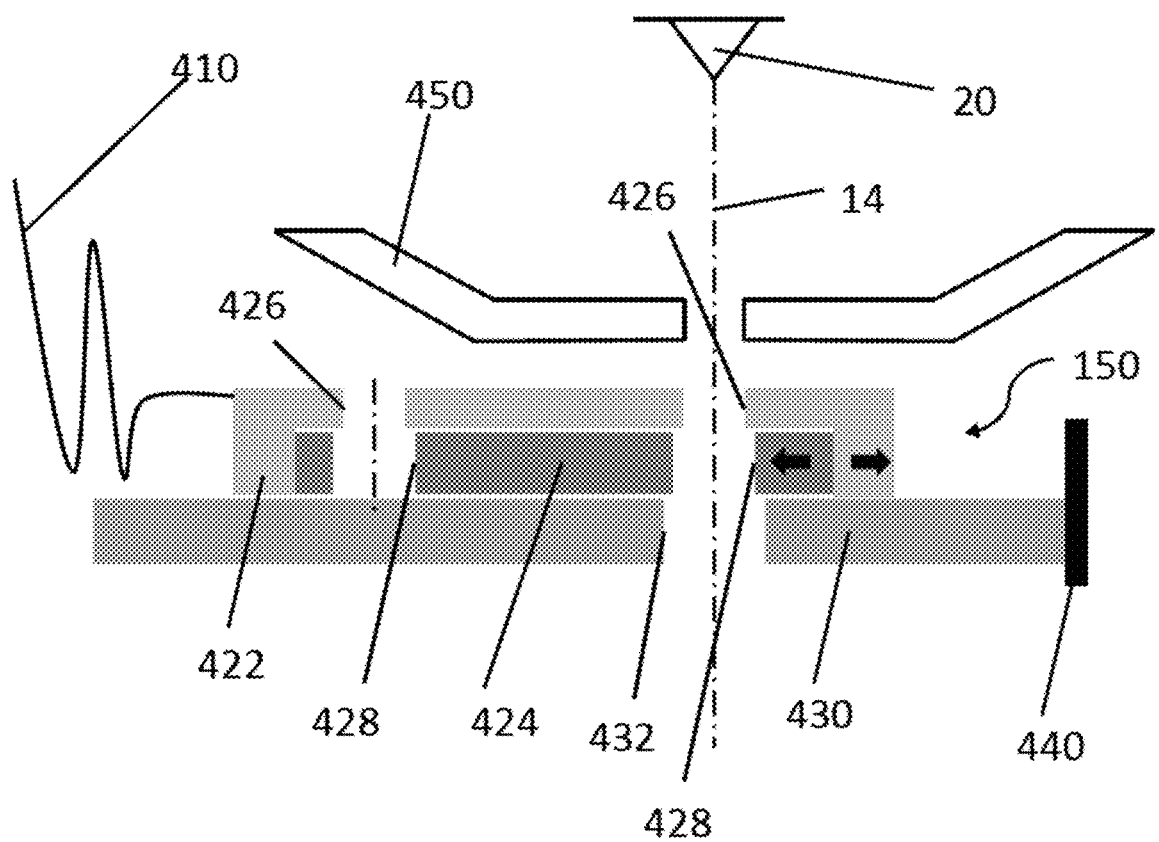
FIG. 4 shows a schematic view of a movable stage with electrical connections according to embodiments described herein.

FIG. 4 shows a schematic view of a movable stage 150 with electrical connections 410 according to embodiments described herein. The movable stage 150 is provided on a support, e.g. an anti-vibration support 430. The anti-vibration support 430 is (pivotally) mounted to a stage support 440. The stage support 440 may be a membrane. The stage support may be made of e.g. at least one of a polymer, a metal or a ceramic. The anti-vibration support 430 carries a movable stage 150 that may be divided in two parts.

A first stage 422 can be movable in a direction as exemplarily indicated in FIG. 4 with arrows. The first stage may be movable in a x-direction. The first stage may be movable in at least one direction. The first movable stage may be rotatable around a substantially vertical axis and/or a substantially horizontal axis, such as e.g. an axis along the x-direction or an axis perpendicular to the x-direction. A second stage 424 is movable in a direction normal to the schematic view of exemplary FIG. 4. The second stage may be movable in a direction perpendicular to the first stage. The second stage may be movable in a y-direction. The second stage may be movable in at least one direction. The second stage may be rotatable around an axis that is substantially vertical. The second stage may be rotatable around a substantially vertical axis and/or a substantially horizontal axis, such as e.g. an axis along the x-direction or an axis perpendicular to the x-direction.

In an exemplary embodiment as shown in the schematic cross-section of FIG. 4, the first stage 422 may have two or more openings, e.g. four openings 426, (of which two are shown in FIG. 4). Each opening may be configured to have at least a first and a second aperture array. The openings 426 may have a shielding, such as e.g. liner tubes, to prevent electrical cross-talk. The second stage 424 may have two openings 428, for example, having a shielding, such as e.g. liner tubes. The openings 428 of the second stage 424 may align concentrically with at least some of the openings 426 of the first stage 422. The anti-vibration support 430 may have one or more openings 432. The one or more openings 432 of the anti-vibration support 430 may align concentrically with at least one of the openings 426, 428 of the first stage 422 and the second stage 424. Exemplary FIG. 4 shows a valve plate 450.

According to some embodiments, which can be combined with other embodiments described herein, the movable stage may be moved by e.g. piezo modules. A piezo module may move the movable stage at least in one direction. A piezo module may rotate the movable stage at least around one axis. A friction bar may be integrated into the movable stage. The friction bar may be a ceramic bar. The piezo module may move the movable stage via the friction bar. The piezo module may rotate the movable stage via the friction bar. The movable stage may comprise at least one encoder, for example, to encode for a position or a change of position of the movable stage. The movable stage may comprise at least one encoder, for example, to encode for a rotation or an angular displacement of the movable stage.

According to some embodiments, which can be combined with other embodiments described herein a movable stage may move the assembly of aperture arrays more than 5 mm, more than 10 mm, more than 15 mm, or more than 20 mm in at least one direction. Additionally or alternatively, the movable stage may move the assembly of aperture arrays less than 60 mm, less than 50 mm, or less than 40 mm. The distance between a first aperture array and a second aperture array may be more than 10 mm, more than 15 mm, more than 20 mm, or more than 30 mm. Additionally or alternatively, the distance between a first aperture array and a second aperture array may be less than 60 mm, less than 50 mm, or less than 40 mm. The movable stage may be movable in a spherical space with a diameter larger than 140 mm, 150 mm, 160 mm, or 170 mm. Additionally or alternatively, the movable stage may be movable in a spherical space with a diameter smaller than 200 mm, 190 mm, or 180 mm.

According to some embodiments, which can be combined with other embodiments described herein, the support, e.g. the anti-vibration support, may comprise one liner tube for shielding. The liner tube of the anti-vibration support may be concentrically aligned with the charged particle beam 14 or the primary charged particle beam. The anti-vibration support may be held in place by the stage support, for example, a membrane, such as e.g. a metal membrane. The membrane may beneficially compensate for vibrations.

According to some embodiments, which can be combined with other embodiments described herein, shielding may be provided with liner tubes. Liner tubes may be replaceable. Liner tubes may be held in place by e.g. latching coil springs.

Figure 5:
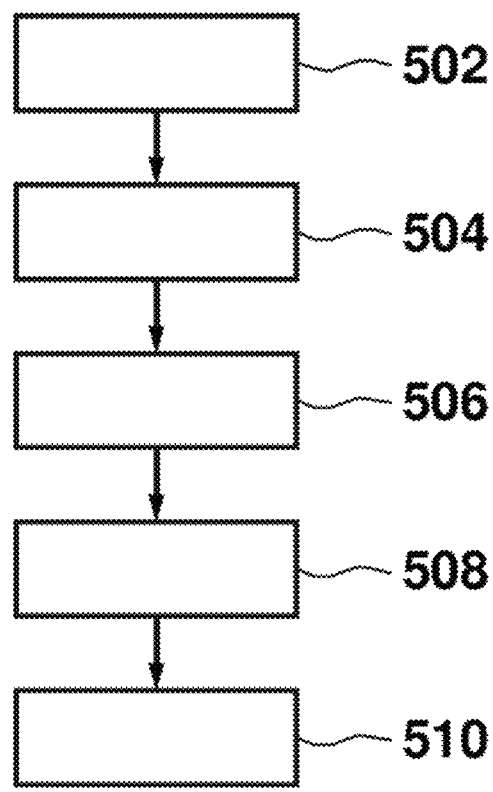
FIG. 5 shows a flowchart of a method for operating a charged particle beam device according to embodiments described herein.

Operating a movable stage to change an aperture aligned with the charged particle beam according to embodiments of methods for operating a charged particle beam device as exemplarily illustrated in FIG. 5. A primary charged particle beam is generated (see box 502), for example, with a charged particle source 20 (see FIG. 1). A plurality of beamlets may be generated by an aperture array 122, 126. For example, as illustrated by box 504, a first beamlet is generated from the primary charged particle beam and a second beamlet is generated from the primary charged particle beam. The first beamlet and the second beamlet are scanned over a specimen (see box 506). For example, the first beamlet and the second beamlet can be scanned in a synchronized manner by a scanning deflector 12 shown in FIG. 1. A first aperture array 122 may be aligned with the primary beam by a movable stage. The movable stage may be moved by an actuator assembly, as illustrated by box 508. An operation mode of the particle beam device 100 may be changed by moving the first aperture array 122 out of the primary charged particle beam and aligning a second aperture array 126 with the primary charged particle beam (see box 510). Accordingly, an aperture array may be changed with the movable stage moved by the actuator assembly. Accordingly, a beam current may be changed by changing the aperture array and thus the aperture and/or apertures. The method may beneficially reduce the time to change a beam current of a charged particle beam device.

While the foregoing is directed to embodiments of the disclosure, other and further embodiments of the disclosure may be devised without departing from the basic scope thereof, and the scope thereof is determined by the claims that follow.

The invention claimed is:

1. A charged particle beam device, comprising:
   a charged particle source configured to emit a charged particle beam;
   a movable stage comprising an assembly of aperture arrays having at least a first aperture array and a second aperture array,
   the movable stage is configured to align a selected one of either the first aperture array or the second aperture array with the charged particle beam;
   the first aperture array comprises a first shielding tube coupled to the movable stage; and
   the second aperture array comprises a second shielding tube coupled to the movable stage;
   wherein the charged particle beam device is an electron microscope,
   wherein the first aperture array has at least two apertures for a first operation mode of the electron microscope and the second aperture array has at least one aperture for a second operation mode of the electron microscope, and
   wherein the first aperture array comprises at least two deflectors aligned to each of the at least two apertures of the first aperture array, and the second aperture array comprises at least one deflector aligned to the at least one second aperture of the second aperture array.

2. The charged particle beam device of claim 1, wherein the movable stage comprises an actuator assembly configured to translate the aperture array.

3. The charged particle beam device of claim 1, wherein the movable stage is a Piezo stage.

4. The charged particle beam device of claim 1, wherein the movable stage is mounted on a support.

5. The charged particle beam device of claim 1, wherein the movable stage aligns either the at least two apertures of the first aperture array or the at least one aperture of the second aperture array with the particle beam through at least one of a translation and a rotation of the aperture array.

6. The charged particle beam device of claim 1, wherein at least one of the first shielding tube or the second shielding tube is made of mu-metal or a non magnetic material.

7. The charged particle beam device of claim 1, wherein the assembly of aperture arrays is provided in a part of the movable stage that is movable in an x-direction and having a first number of shieldings and wherein a part of the movable stage that is movable in a y-direction comprises a second number of shieldings smaller than the first number of shieldings.

8. The charged particle beam device of claim 1, wherein the assembly of aperture arrays comprises three layers that contain shielding tubes for shielding.

9. The charged particle beam device of claim 1, wherein the charged particle beam device comprises three layers comprising shielding tubes for shielding, wherein the number of shielding tubes differs between the layers.

10. The charged particle beam device of claim 1, wherein the movable stage comprises electrical circuits connected to the first aperture array and the second aperture array.

11. A method for operating a charged particle beam device, comprising:

operating a movable stage to change a first aperture array aligned with a charged particle beam, the first aperture array having a first shielding tube coupled to the movable stage, by moving the first aperture array out of the charged particle beam and aligning a second aperture array with the charged particle beam, the second aperture array having a second shielding tube coupled to the movable stage, thereby changing an operation mode of the charged particle beam device;

wherein the charged particle beam device is operated as an electron microscope, wherein the first aperture array has at least two apertures for a first operation mode of the electron microscope and the second aperture array has at least one aperture for a second operation mode of the electron microscope, and wherein the first aperture array comprises at least two deflectors aligned to each of the at least two apertures of the first aperture array, and the second aperture array comprises at least one deflector aligned to the at least one second aperture of the second aperture array.

12. The method of claim 11, wherein the first aperture array and the second aperture array is configured to be electrically controllable.

13. The charged particle beam device of claim 1, wherein a size of the first aperture is different from a size of the second aperture.

14. The charged particle beam device of claim 1, wherein the movable stage comprises an actuator assembly configured to rotate the aperture array.

15. The charged particle beam device of claim 1, wherein the movable stage is mounted on an anti-vibration support.

16. The charged particle beam device of claim 1, wherein the first shielding tube and/or the second shielding tube has the form of a liner tube.

* * * * *